United States Patent
Tanaka

(10) Patent No.: US 6,850,439 B1
(45) Date of Patent: Feb. 1, 2005

(54) NON-VOLATILE SEMICONDUCTOR MEMORY DEVICE WITH NAND STRING MEMORY TRANSISTOR CONTROLLED AS BLOCK SEPARATION TRANSISTOR

(75) Inventor: Tomoharu Tanaka, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/801,597

(22) Filed: Mar. 17, 2004

(30) Foreign Application Priority Data

Oct. 10, 2003 (JP) .................................. 2003-351893

(51) Int. Cl.[7] .............................................. G11C 16/16
(52) U.S. Cl. ............................ 365/185.17; 365/185.12; 365/185.11; 365/185.27
(58) Field of Search ...................... 365/185.17, 185.12, 365/185.11, 185.27, 185.33, 185.29

(56) References Cited

U.S. PATENT DOCUMENTS 6,295,227 B1    9/2001    Sakui et al. ............ 365/185.17
6,411,548 B1    6/2002    Sakui et al. ............ 365/185.17

FOREIGN PATENT DOCUMENTS

| JP | 11-176177 | | 7/1999 | .......... G11C/16/02 |
| JP | 2000222895 A | * | 8/2000 | .......... G11C/16/02 |
| JP | 2002026153 A | * | 1/2002 | ....... H01L/21/8247 |

* cited by examiner

*Primary Examiner*—Andrew Q. Tran
(74) *Attorney, Agent, or Firm*—Oblon, Spivak, McClelland, Maier & Neustadt, P.C.

(57) ABSTRACT

A non-volatile semiconductor memory device includes: a memory cell array having NAND strings arranged therein, each NAND string having a plurality of electrically rewritable and non-volatile memory transistors connected in series; and an erase/write/read control circuit configured to perform erasing, writing and reading of the memory cell array, wherein at least one memory transistor within each NAND string of the memory cell array is controlled as a block separation transistor for dividing the memory cell array into a plurality of blocks each serving as a unit of data erasure.

23 Claims, 16 Drawing Sheets

|  | Erase | "0" Write | "1" Write | Read | Write-Verify |
|---|---|---|---|---|---|
| BLe | Floating | 0V | Vdd | H or L | H or L |
| BLo | Floating | Vdd | Vdd | 0V | 0V |
| SGD | Floating | Vdd | Vdd | 4.5V | 4.5V |
| WL7 | Floating | 4.5V | 4.5V | 4.5V | 4.5V |
| WL6 | Floating | 4.5V | 4.5V | 4.5V | 4.5V |
| WL5 | Floating | 4.5V | 4.5V | 4.5V | 4.5V |
| WL4 | Floating | 4.5V | 4.5V | 4.5V | 4.5V |
| SGi1 | Floating | Vdd | Vdd | 4.5V | 4.5V |
| SGi0 | Floating | Vdd | Vdd | 4.5V | 4.5V |
| WL3 | 0V | 10V | 10V | 4.5V | 4.5V |
| WL2 | 0V | 10V | 10V | 4.5V | 4.5V |
| WL1 | 0V | Vpgm | Vpgm | 0V | 0.4V |
| WL0 | 0V | 10V | 10V | 4.5V | 4.5V |
| SGS | Floating | 0V | 0V | 4.5V | 4.5V |
| CELSRC | Floating | 0V | 0V | 0V | 0V |
| C-p-well | 20V | 0V | 0V | 0V | 0V |

FIG. 9

|  | Erase | "0" Write | "1" Write | Read | Write-Verify |
|---|---|---|---|---|---|
| BLe | Floating | 0V | Vdd | H or L | H or L |
| BLo | Floating | Vdd | Vdd | 0V | 0V |
| SGD | Floating | Vdd | Vdd | 4.5V | 4.5V |
| WL7 | 0V | 10V | 10V | 4.5V | 4.5V |
| WL6 | 0V | 10V | 10V | 4.5V | 4.5V |
| WL5 | 0V | Vpgm | Vpgm | 0V | 0.4V |
| WL4 | 0V | 10V | 10V | 4.5V | 4.5V |
| SGI1 | Floating | 0V | 0V | 4.5V | 4.5V |
| SGI0 | Floating | 0V | 0V | 4.5V | 4.5V |
| WL3 | Floating | 4.5V | 4.5V | 4.5V | 4.5V |
| WL2 | Floating | 4.5V | 4.5V | 4.5V | 4.5V |
| WL1 | Floating | 4.5V | 4.5V | 4.5V | 4.5V |
| WL0 | Floating | 4.5V | 4.5V | 4.5V | 4.5V |
| SGS | Floating | 0V | 0V | 4.5V | 4.5V |
| CELSRC | Floating | 0V | 0V | 0V | 0V |
| C-p-well | 20V | 0V | 0V | 0V | 0V |

WL7–WL4: BLKi
WL3–WL0: BLKi-1

| | Erase | "0" Write | "1" Write | Read | Write-Verify |
|---|---|---|---|---|---|
| BLe | Floating | 0V | Vdd | H or L | H or L |
| BLo | Floating | Vdd | Vdd | 0V | 0V |
| SGD | Floating | Vdd | Vdd | 4.5V | 4.5V |
| WL7 | Floating | 10V | 10V | 4.5V | 4.5V |
| WL6 | Floating | 10V | 10V | 4.5V | 4.5V |
| WL5 | Floating | 10V | 10V | 4.5V | 4.5V |
| WL4 | Floating | 10V | 10V | 4.5V | 0.4V |
| SGI1 | 0V | Vpgm | Vpgm | 4.5V | 4.5V |
| SGI0 | 0V | 10V | 10V | 0V | 1V |
| WL3 | Floating | 10V | 10V | 4.5V | 4.5V |
| WL2 | Floating | 10V | 10V | 4.5V | 4.5V |
| WL1 | Floating | 10V | 10V | 4.5V | 4.5V |
| WL0 | Floating | 10V | 10V | 4.5V | 4.5V |
| SGS | Floating | 0V | 0V | 4.5V | 4.5V |
| CELSRC | Floating | 0V | 0V | 0V | 0V |
| C-p-well | 20V | 0V | 0V | 0V | 0V |

BLKi: BLe, BLo, SGD, WL7, WL6, WL5, WL4
BLKi-1: WL3, WL2, WL1, WL0

NON-VOLATILE SEMICONDUCTOR MEMORY DEVICE WITH NAND STRING MEMORY TRANSISTOR CONTROLLED AS BLOCK SEPARATION TRANSISTOR

CROSS-REFERENCE TO PRIOR APPLICATION

This application is based upon and claims the benefit of priority from the prior Japanese Patent Application No. 2003-351893, filed on Oct. 10, 2003, the entire contents of which are incorporated herein by reference.

BACKGROUND OF THE INVENTION

1. Field of the Invention

The present invention relates generally to an electrically rewritable non-volatile semiconductor memory device such as electrically erasable programmable read only memory (EEPROM). More particularly but not exclusively, this invention relates to a "flash" memory of a NAND type.

2. Description of Related Art

Flash memories are designed to store as data different threshold voltage states of a memory cell (memory transistor) in a way pursuant to the amount of electrical charge of a floating gate thereof. For example, a flash memory stores a negative threshold state as a bit of logic "1" data and stores a positive threshold state as a logic "0" data bit. Data rewriting (erasure and write), also known as reprogramming, is performed by electrically changing the charge amount of the floating gate of a memory cell.

Currently available flash memories include a flash memory chip of the NAND type. In this NAND flash memory, a plurality of memory cells are connected in series together to constitute a NAND string (cell unit). The NAND string has its one terminate end which is connected to a bit line through a first select gate transistor and the other end which is connected to a source line via a second select gate transistor. The multiple memory cells within the NAND string are such that adjacent ones commonly have or "share" a source or drain diffusion layer therebetween. Thus it is possible to make the ratio of a region of a select gate transistor or a contact portion to a single memory cell smaller than that of NOR type flash memories. This leads to achievement of flash memories with higher integration densities.

Controlling memory cells other than a selected memory cell in a NAND string to serve as a current flow path during writing or reading sessions, it is possible to selectively perform writing or reading of a memory cell within the NAND string. A general approach to doing erasure to as follows; all of the memory cells within the NAND string are selected simultaneously and then erased together at a time.

More concretely explaining, a group of memory cells arranged in the direction of a word line constitutes either a single page or two pages, while a group of NAND strings arranged in the direction of word lines makes up a block. And, data read or data write is performed by a page; and data erase by a block.

Although NAND flash memories are capable of lessening the size of a NAND string per se by reducing a minimum device feature size, it is unlikely that select gate transistors and contact portions are shrinkable in a way simply proportional to their microfabrication sizes. To solve this problem, a technique has been proposed for improving the wiring structures of select gate transistors to thereby achieve further increased densities of NAND flash memories. This approach is disclosed, for example, in Published Japanese Patent Application No. 2002-26153 (JP-A-2002-26153).

On the other hand, when an attempt is made to maintain the high integration density of a flash memory by increasing the number of those memory cells making up a NAND string, the unit of data erasure becomes larger, resulting in a decrease in usability. Regarding this point, a technique has been proposed for performing data erase on a per-page basis or alternatively in units of sub-blocks each including a plurality of pages. This is disclosed, for example, in JP-A-11-176177. Another technique has also been proposed, which makes use of more than one separation-use transistor to subdivide a block into a plurality of sub-blocks, each of which is for use as an erase unit. An example of this technique is found in JP-A-2000-222895.

In a scheme for performing data erasing on a per-page basis or in units of sub-blocks without modifying the cell array configuration of prior known NAND flash memories, erase stress or write stress may be applied to the memory cells of not-selected or "unselected" subblocks at the time of data writing. This in turn causes a problem that the number of data rewrite is limited.

On the contrary, the use of a scheme for disposing a separation-use transistor or transistors within a block makes it possible to reduce the erase stress and write stress of unselected blocks. However in order to mike sure that the subblock separation or isolation while suppressing the erase and write stresses, it is desired to offer an ability to adjust the threshold levels of such separation transistors to an optimal value.

SUMMARY OF TUE INVENTION

According to one aspect of the present invention, there is provided a non-volatile semiconductor memory device including:

a memory cell array having NAND strings arranged therein, each NAND string having a plurality of electrically rewritable and non-volatile memory transistors connected in series; and an erase/write/read control circuit configured to perform erasing, writing and reading of the memory cell array, wherein at least one memory transistor within each NAND string of the memory cell array is controlled as a block separation transistor for dividing the memory cell array into a plurality of blocks each serving as a unit of data erasure.

BRIEF DESCRIPTION OF THE DRAWINGS

FIG. 9 is a diagram showing, in table form operating bias conditions of the flash memory at the time of selecting a block BLKi-1 thereof.

FIG. 10 is a diagram showing, in table form, operating bias conditions of the flash memory upon selection of a block BLKi.

FIG. 11 is a diagram showing, in table form, operating bias conditions of the flash memory when selecting a transistor for block separation use.

DETAILED DESCRIPTION OF THE EMBODIMENTS

Embodiments of this invention will be set forth with reference to the accompanying drawings below.

Figure 1:
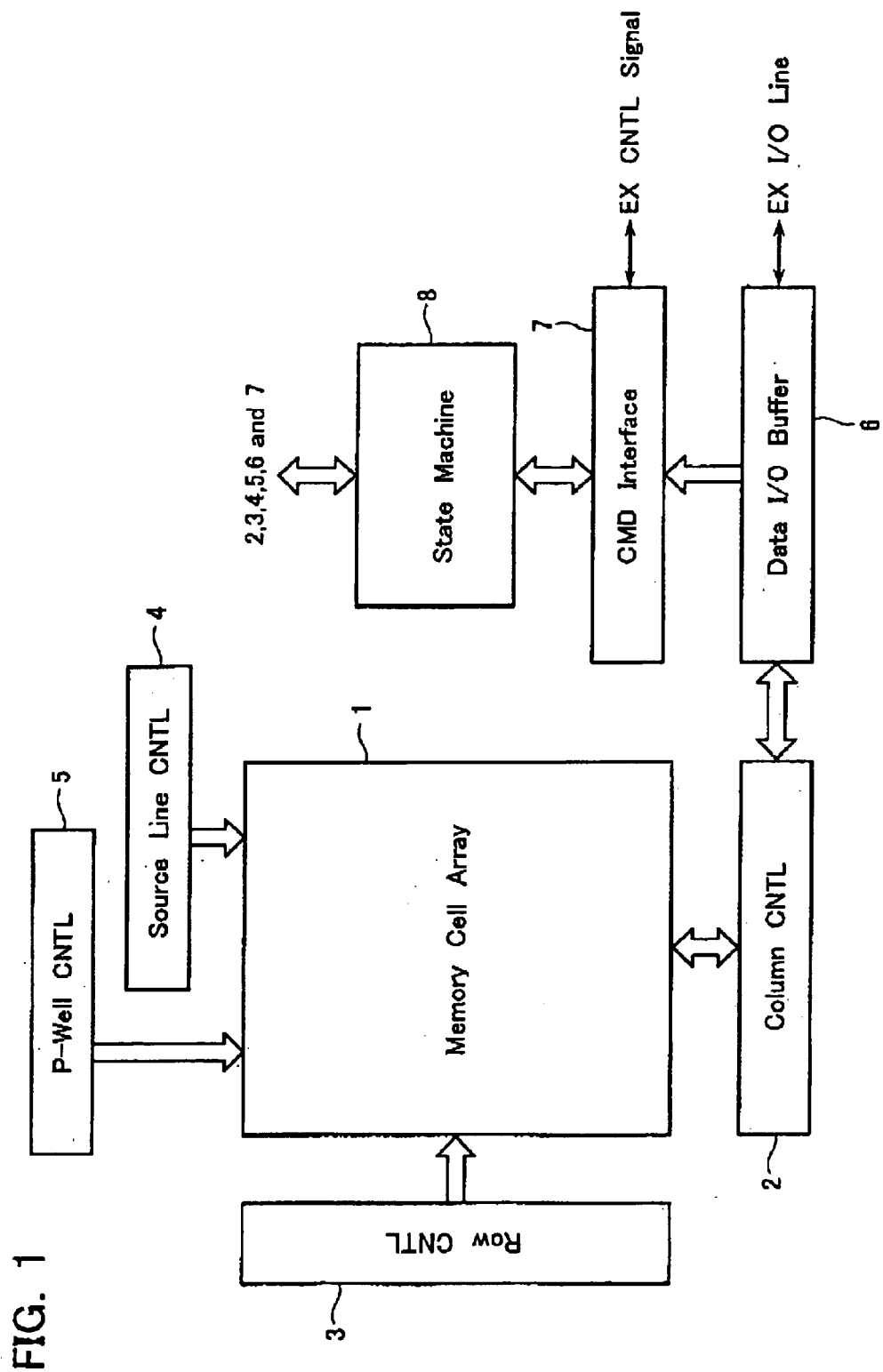
FIG. 1 is a diagram showing, in functional block for a configuration of a NAND flash memory chip in accordance with an embodiment of this invention.

FIG. 1 illustrates, in functional block diagram form, a configuration of a flash EEPROM chip of the NAND type in accordance with one embodiment of the invention. The NAND flash memory includes a memory cell array 1, which is generally configured from a matrix of rows and columns of electrically rewritable or "reprogrammable" nonvolatile memory transistors (memory cells). The memory cell array 1 is operatively associated with a column control circuit 2 which is provided adjacent thereto. This column control circuit 2 is for control of bit lines of the memory cell array 1 to thereby perform data erasure of a memory cell(s), data write into a memory cell(s), and data read out of a memory cell(s). The column control circuit 2 has a sense amplifier circuit for reading cell data, a data latch circuit for retaining read and write data, and column select gates.

A row control circuit 3 is provided for selecting a word line of the memory cell array 1 and for applying voltages necessary for erase, write and read operations to a selected word line and non-selected or "unselected" word lines. More specifically, the row control circuit 3 includes a row decoder for selection of a word line, and a word-line driver for giving prespecified drive voltages to the selected and unselected word lines. Additionally provided are a source-line control circuit 4 and a well control circuit 5, wherein the former is for control of a common source line of the memory cell array 1, whereas the latter is for controlling the voltage of a p-type well region on which the memory cell array 1 is formed.

In short, these control circuits 2 to 5 make up an erase/write/read control circuit which is operable to give, necessary control voltages to respective parts of the memory cell array 1 in a way responsive to an operation mode to thereby perform data erase read and write operations.

A data input/output (I/O) buffer 6 is provided, which is connected through I/O terminals to an externally associated host device (not depicted) for performing receipt of write data, outputting of read data, and receipt of address data and/or command data. The data I/O buffer 6 is operable to send the received write data toward the column control circuit 2 while receiving read data from the column control circuit 2; in addition, the I/O buffer 6 passes externally incoming address data to the column control circuit 2 and the sow control circuit 3 through a state machine 8. A command interface 7 receives external control signals from the host device and then determines whether the data as input to the data I/O buffer 6 is write data or command date or address data. If the received data is the command data, the interface 7 transfers it toward the state machine 8 in the form of a command signal.

The state machine 8 performs management of an entirety of the flash memory chip. More specifically, this machine is responsive to receipt of a command from the host device, for providing controls of read, write and erase while performing data I/O control operations.

Figure 2:
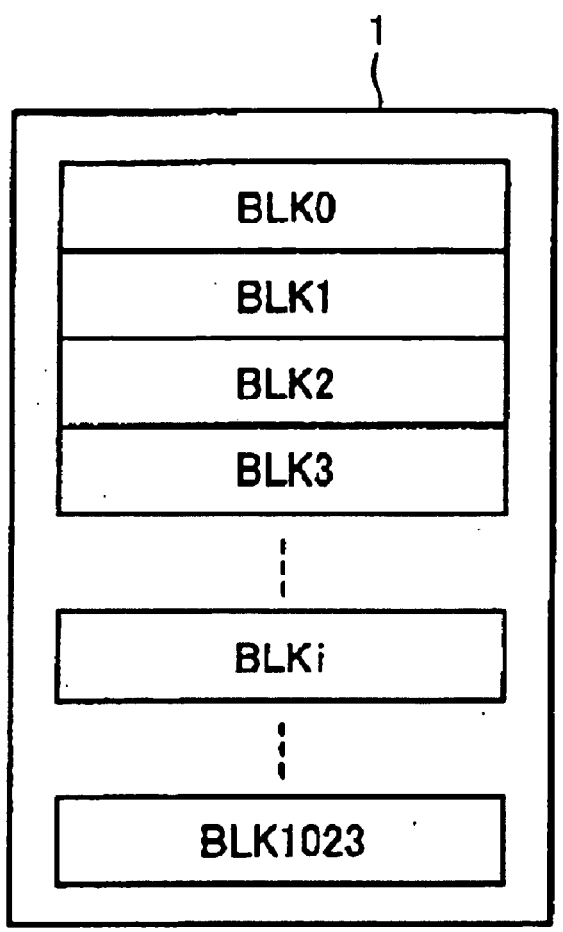
FIG. 2 is a diagram showing a configuration of a memory cell array of the flash memory.
Figure 3:
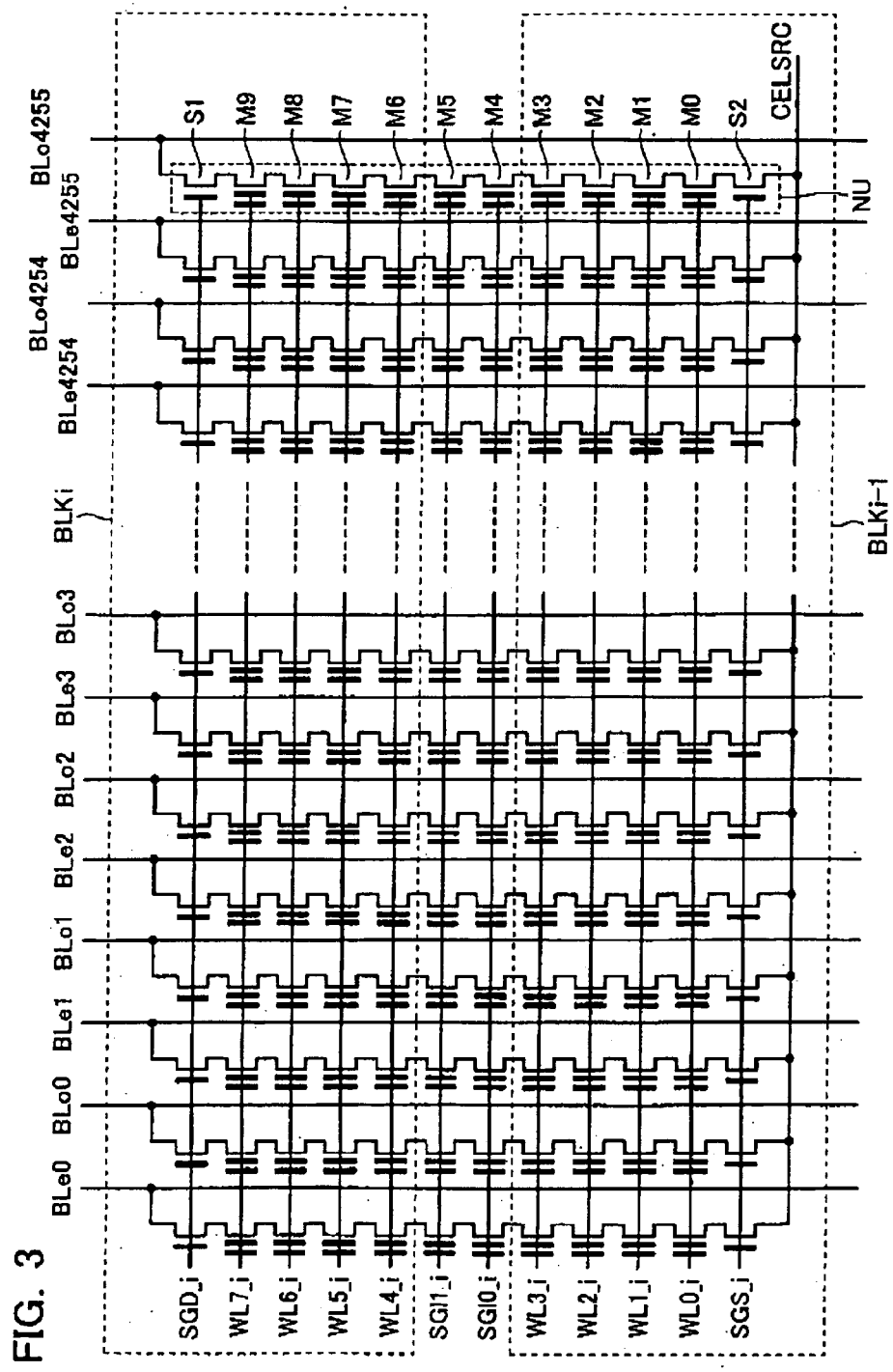
FIG. 3 is a diagram showing a more detailed configuration of the memory cell array.

FIG. 2 depicts a configuration of the memory cell array 2. As shown herein, the memory cell array 1 is subdivided into a plurality of blocks BLK0 to BLK1023. Each block BLKi is a unitary part or "unit" for data erasure. A more detailed configuration of memory cell array 1 is shown in FIG. 3. As better seen from FIG. 3, memory cells (memory transistors) are laid out at respective crossing portions or "intersections" of bit lines BL and word lines WL that cross over each other. Here, ten (10) memory transistors M0–M9 are connected in series to make up a NAND string (NAND cell unit) NU. Each NAND string has both end portions at which select gate transistors S1 and S2 are disposed respectively.

More specifically, one end of each NAND string NU is connected through a select gate transistor S1 to a bit line BL, whereas the other end via a select gate transistor S2 to a common source line CELSRC. The ten memory transistors M0–M9 include four memory transistors M0–M3 which are located closer to the common source-line contact side. These transistors M0–3 have their control gates connected to word lines WL0–WL3, respectively. The control gates of other four memory transistors M6–M9 on the bit-line contact side are connected to word lines WL4–WL7, respectively.

In this embodiment, in the ten memory transistors M0–M9 making up a NAND string NU, two successive memory transistors M4 and M5, which are almost centrally disposed in the NAND string NU are not used for data storage; these are used as "block separation transistors". Accordingly, these block separation-use or "separator" transistors M4–M5 are respectively connected at their control gates to block separation gate lines SGI0 and SGI1. These gate lines SGI have been formed at the same time during fabrication of the word lines WL in such a way as to extend in parallel to the word lines. The select gate transistors S1–S2 have gates which are connected to select gate lines SGD and SGS extending in parallel to word lines WL, respectively.

In this embodiment, an area or "range" of the memory cell array 1 which has its length equivalent to the length of one NAND string is divided into two blocks BLKi-1 and BLKi in the bit line direction. The block separation gate lines SGI0 and SGI1 for control of the centrally located memory transistors M4–M5 are interposed between the divided blocks BLKi-1 and BLKi. Each of these blocks BLKi-1, BLKi serves as a unit of data erasure, which is subjected to data erase independently of others. Very importantly, this embodiment is distinguishable over currently available NAND flash memories in that whereas the latter is such that a range of one NAND string length in the memory cell array is handled as a block serving as the data erase unit, the former is specifically arranged so that a one block in the prior art is divided into two portions—namely, subblocks.

In memory cells connected to even-numbered bit lines BLe0 to BLe4225, and in memory cells connected to odd-numbered bit lines BLo0–BLo4225, data write and read are performed in a way independent of each other. More precisely, data write is performed simultaneously with respect to 4,256 memory transistors of 8,512 memory transistors coupled to a single word line WL, which are connected to even bit lines BLe. The same goes with data read. Assuming that each memory transistor stores a one (1) bit of data, data bits of 4,256 memory transistors constitute a page of data. Similarly, 4,256 memory transistors connected to the odd bitlines BLo make up another page, wherein each of data write is and read is done simultaneously with respect to memory transistors within the page.

Figure 4:
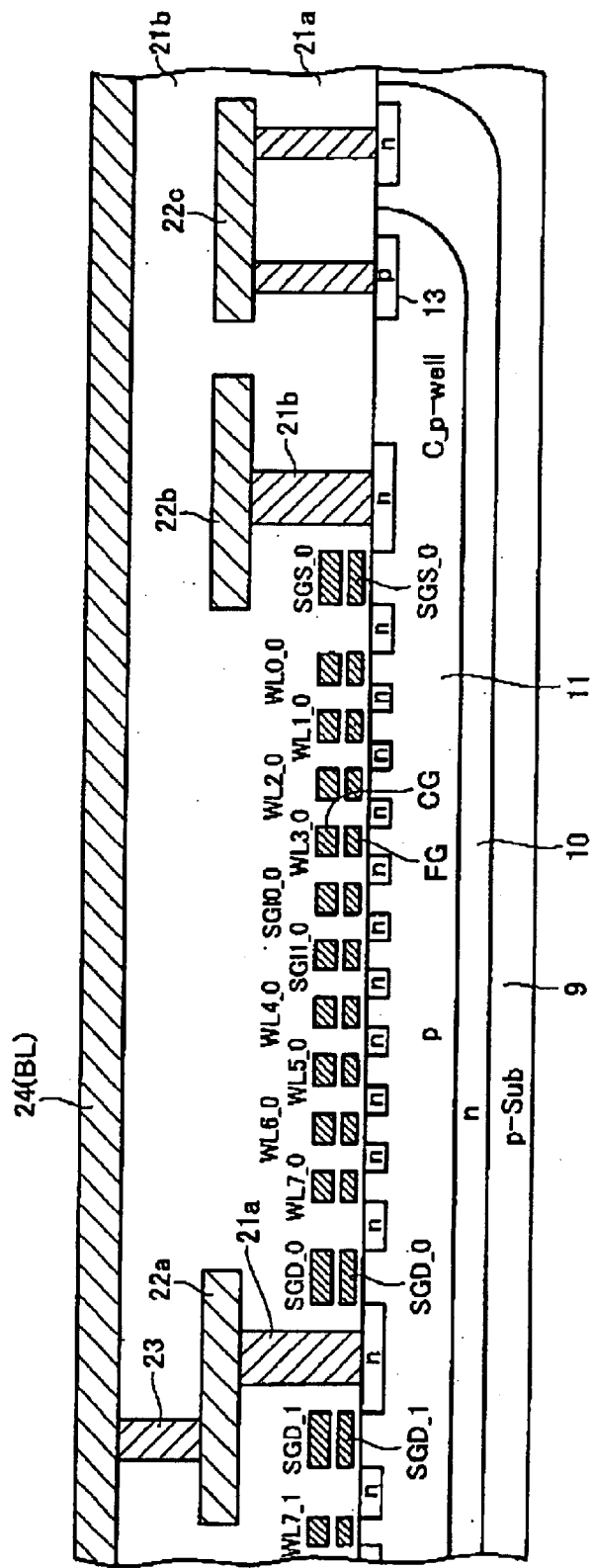
FIG. 4 is a diagram showing a cross-sectional structure of the memory cell array as taken along a bit line thereof.

FIG. 4 shows a cross-sectional structure of the memory cell array 1 as taken along a bit line BL. A silicon substrate 9 has its top surface, in which an n-type well region 10 is formed. In this n-type well 10, a p-type well region 11 is formed. The memory cell array 1 is formed within this p-type well 11. Each memory transistor has an n-type source/drain region 12 which is shared by its neighboring memory transistor, and a stacked gate structure with a floating gate FG and a control gate CG insulatively stacked or multilayered over the gate FG. The control gate CG is patterned to extend into a plurality of memory transistors, thereby constituting a word line WL.

The memory transistors M4–M5 for use as the block separation transistors also have a stacked or multilayer gate structure which is similar to that of the other memory transistors. While the control gates of these block separator transistors M4–M5 are patterned in a similar way to the word lines, these serve as block separation-use gate lines SGI0–SGI1. Although the select gate transistors S1–S2 at the both ends of NAND string also are principally similar in structure to the memory transistors M, stacked gates corresponding to the floating gate FG and control gate CG are patterned as double-structured select gate lines SGD and SCS.

The word lines WL, select gate lines SGD and SGS, and block separation gate lines SGI0–SGI1 are connected to the row control circuit 3.

One end of the NAND string (i.e., drain diffusion layer of select gate transistor S1) is connected through an electrical contact plug 21a to an interconnect wiring lead 22a for intermediate signal transfer use, which is formed of a first layer of metal as formed on an interlayer dielectric film 20a. This relay wire 22a is further connected via a contact plug 23 to a bit line (BL) 24 which is made of a second-layer metal formed on an interlayer dielectric film 20b. The bit line BL is connected to the column control circuit 2.

The other end of the NAND string (source diffusion layer of select gate transistor S2) is connected through a contact plug 21b to a common source line (CELSRC) 22b, which is a first-layer metal wire. The common source line CELSRC is connected to the source-line control circuit 4. Additionally, a well wire 22c is formed on the interlayer dielectric film 20a, which is formed of the first-layer metal and connected to both the n-type well 10 and the p-type well 11. This well wire 22c is connected to the well control circuit 5.

Figure 5:
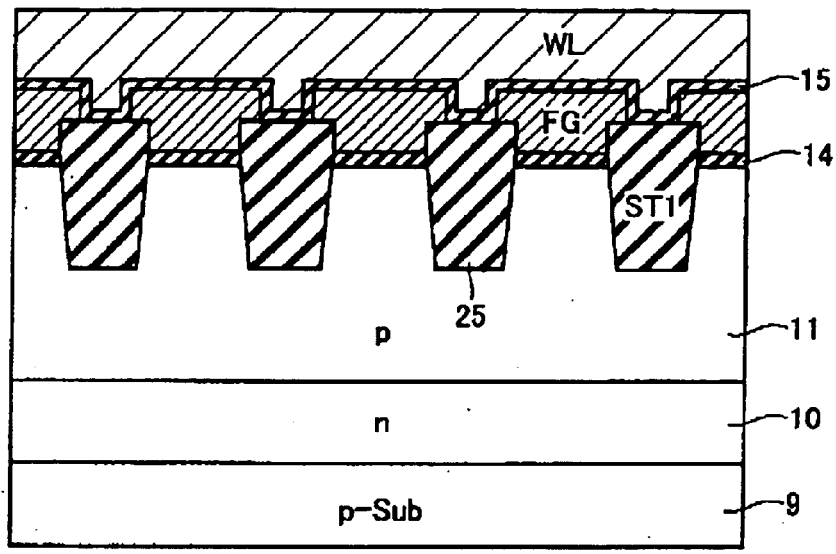
FIG. 5 is a diagram showing a sectional structure of the memory cell array taken along a word line.
Figure 6:
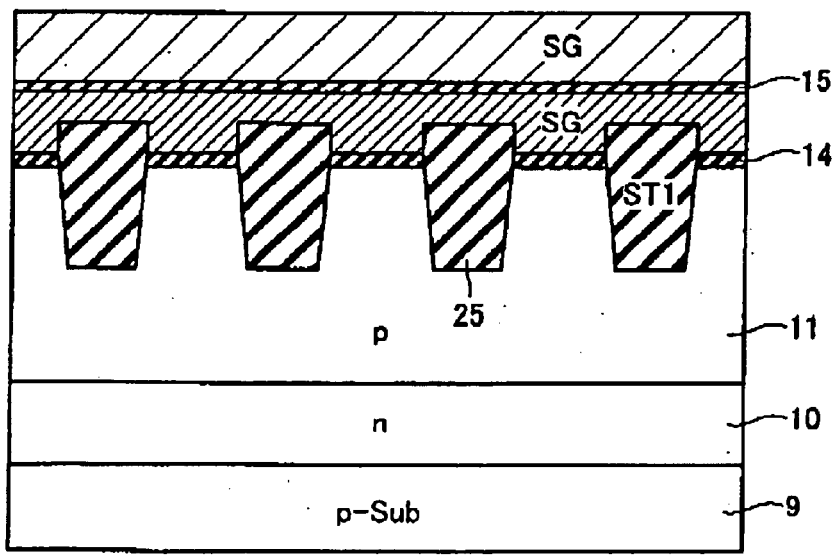
FIG. 6 is a diagram showing a sectional structure of the memory cell array along a select gate line.

FIG. 5 shows a cross-sectional structure of the memory cell array 1 in a direction along the word, lines WL, while FIG. 6 depicts a sectional structure thereof in a direction along the select gate line SGD (SGS). In this direction, adjacent ones of the memory transistors are separated or isolated from each other by an element-isolating dielectric film 25, which is formed by shallow trench isolation (STI) method. In each element formation area that is partitioned by element isolating dielectric film 25, a floating gate FG is formed with a tunnel oxide film 14 sandwiched between it and p-well 11. A control gate CG is formed over the floating gate FG with an oxide-nitride-oxide (ONO) film 15 laid therebetween. As previously stated, the control gate CG continuously extends as a word line WL. The sectional structure along the block separation select gate line SGI0, SGI1 is identically the same as that along this word line WL.

As shown in FIG. 6, any floating gate separation is not performed in the cross-section along the select gate line SGD (or SGS), resulting in establishment of a multilayered wiring structure of two layers. These upper and lower wires are brought into contact with each other at a terminate end of the memory cell array 1; alternatively, these wires are contacted together at regularly spaced portions with an interval corresponding to a predetermined number of bit lines.

Figure 7:
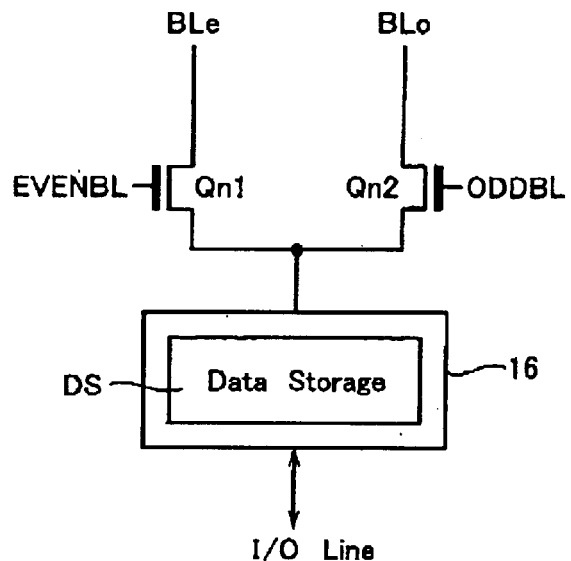
FIG. 7 is a diagram showing a configuration of a data storage circuit in a column control circuit of the flash memory.

FIG. 7 shows an arrangement of main part of the column control circuit 2. A sense amplifier (also functionable as a data latch) 16 is provided with respect to two bit lines with the same column number assigned thereto, one of which is an even-numbered bit line BLe (for example, BLe5) and the other of which is an odd-numbered bitline BLo (e.g., BLo5). Either one of the bitlines BLe and BLo is selected and connected to the sense amp 16 so that data writing or reading is performed. More specifically, when a signal EVENBL becomes at "High" or "H" level while a signal ODDBL is at "Low" or "L" level, an NMOS transistor Qn1 turns on causing the even bitline BLe to be selected and connected to the sense amp 16. When the signal EVENBL becomes "L" level and the signal ODDBL in at "H" level, an NMOS transistor Qn2 turns on causing the odd bitline BLo to be selected and coupled to the sense amp 16. The signal EVENBL is in common with respect to all the even bitlines BLe; the signal ODDBL is common to all the odd bitlines BLo. Unselected bitlines BL are controlled by circuitry that is not shown in the drawing.

The sense amp 16 has a binary data storage module DS. This data storage DS is connected via an input/output (I/O) line to the data I/O buffer 6, for storing therein externally entered (input) write data and externally outgoing (output) read data. Also stored in storage DS is a detection result in a write-verify event for verification of the threshold value of a memory cell after writing thereof.

Figure 8:
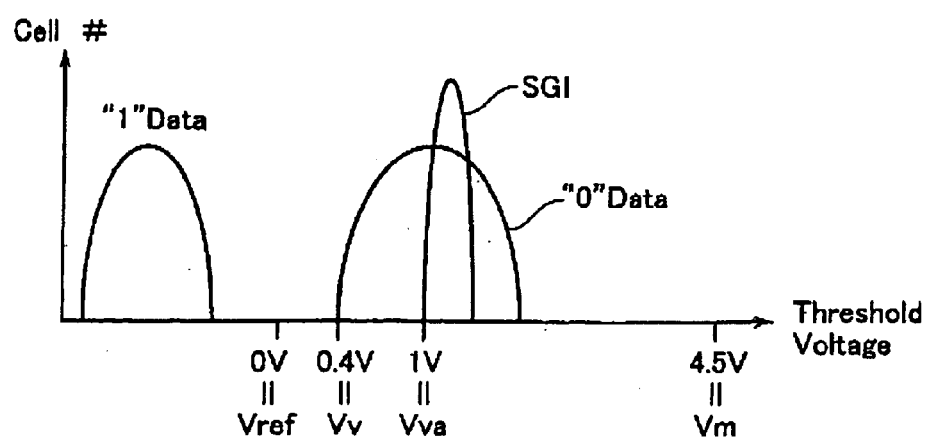
FIG. 8 is a diagram graphically showing data threshold value distribution patterns of the flash memory.

FIG. 8 is a graph showing threshold distribution patterns of the memory transistors of the flash memory in accordance with this embodiment. A state that the threshold value of a memory transistor stays negative in polarity is defined as a data bit of logic "1". When giving a bit of write data of logic "0" to this memory transistor, it becomes to store the data "0" with a positive threshold state. When the write data is a "1", the state of the transistor remains unchanged and retains data "1".

"0" data write is performed by an operation which injects electrons onto the floating gate of a selected memory transistor. To be more concrete, NAND flash memories are typically designed to utilize electron injection from a channel to floating gate due to Fowler-Nordheim (FN) tunneling.

Data erasure is done as an operation for forcing electrons to discharge from the floating gates of all memory transistors within a selected block toward the channels thereof.

Data read is performed by giving a read voltage to a selected memory transistor and then determining whether a cell current flows or not. More concretely, in the case of FIG. 8, if the threshold value is below zero volts (0V), then the stored data is regarded an logic "1"; if the threshold is above 0V then the stored data is logic "0". In brief, data determination is done by giving a read voltage Vref (=0V) to the control gate (word line) of a selected memory transistor.

The block separation transistors M4 and M5 coupled to the block separation gate lines SGI (SGI0 and SGI1) are also electrically controllable in threshold thereof. In this embodiment, the threshold values of these memory transistors (block separator transistors) are accurately set, for example, at 1V prior to product chip shipments and will hardly vary thereafter in usual erase and write events. The memory transistors coupled to this block separation gate line SGI serve for separating a selected block from its neighboring unselected block at the time of per-block data erasing.

An explanation will be given of an operation of the NANP flash memory in accordance with this embodiment below.

FIG. 9 shows, in table form, voltages at some major portions during data erasure, write, read and write-verify operations in the event that one of a block BLKi-1 defined as a range covering word lines WL0–WL3 and a block BLKi defined as a range of word lines WL4–7 is selected that is, at the time of selecting the former block BLKi-1. Write and read are in the case where a word line WL1 and even-numbered bit line BLe are selected within the block BLKi-1.

At the time of data-erasure, apply an erase voltage Vera is (=20V) to the p-type well region 11 while giving a voltage of 0V to all the word lines WL0–WL3 of the selected block BLKi-1. With such voltage application, every memory transistor within the selected block BLKi-1 experiences withdrawal of electrons from its floating gate FG and thus the threshold value becomes negative in polarity, resulting in storage of "1" data (erase State). The unselected block BLKi's word lines WL4–WL7, select gate lines SGD and SGS, block separation gate lines SGI0 and SGI1 and bit lines BL are forced to be electrically floating. Whereby, in the unselected block BLKi, the wordlines WL4–7 are potentially raised or "boosted" up to 20V or nearby potential levels due to the presence of capacitive coupling with p-well 11; thus, no erase operations are performed.

As stated above, not only the word lines WL4–WL7 of the unselected block but also the block separation gate lines SGI0 and SGI1 are set to be electrically floating. In this way, owing to the arrangement that more than one block separation gate line is disposed between the word lines of unselected block and those of selected block, the unselected block word lines are no longer capacitively coupled directly with the selected block word lines in any way. With this feature, any possible erase stress of the unselected block becomes smaller at the time of data erasing.

Data writing or "programming" is as follows. When writing a logic "0", apply a 0V voltage to a selected bit line BLe; when writing a logic "1" (write inhibition), give thereto a chip-inside power supply voltage Vdd (=1.8 to 3V). Apply a write or "program" voltage Vpgm (=12 to 20V) to a selected word line WL1; and apply a voltage of 10V to the remaining unselected wordlines WL0–WL3 within the selected block BLKi-1 to thereby permit potential rise-up of the channel of a memory transistor that is selected for "1" write. Apply to the wordlines WL4–WL7 of unselected block BLKi an intermediate or "mid-level" voltage Vm (=4.5V as shown in FIG. 8) which is higher than the supply voltage Vdd. This voltage Vm is necessary to drive the memory transistors coupled to these wordlines WL4–7 to turn on without regard to the stored date therein. Furthermore, give voltage Vdd to the select gate line SGD on the bitline side to thereby transfer 0V toward the channel of a "0" write NAND string, while at the same time preventing the channel charge of a "1"-write NAND string from being removed. Give Vdd also to the block separation gate line SGI0. SGI1. Set the source-line side select gate line SGS at 0V.

With this voltage application, at a memory transistor which is selected by the selected bit line BLe to which "0" data is given and the selected word line WL1, electrons are injected onto its floating gate FG so that the threshold value increases. At a memory transistor that is selected by a "1" data-given selected bit line BLe and the selected word line WL1, its control gate CG potentially rises up due to the capacitive coupling so that no electrons are injected to the floating gate FG thereof.

In the write event stated above, the voltage of 4.5V being given to the word lines WL4–WL7 of the unselected block BLKi is sufficiently lower in potential than the voltage of 10V to be applied to the unselected wordlines WL1–WL3 within the selected block BLKi-1. Thus the write stress of the memory transistors in the unselected block is suppressed to low levels.

Read-out is performed by applying a read voltage Vref (=0V) to a selected word line WL1. To ensure that memory transistors other than a selected memory transistor and the select gate transistors electrically conduct deep enough to form a current flow path, apply the mid-level voltage Vm (=4.5V) to the select gate lines SGD and SGS, block separation gate lines SGI0 and SGI1, and unselected word lines WL0 and WL2–WL7.

With this voltage setting, if the threshold level of the selected memory transistor is below the read voltage Vref, the bit line BLe and the common source line CELSRC are electrically conducted together, causing the precharged bit line BLe to become at a low potential level L. If the threshold of selected memory transistor is above the read voltage, the bit line BLe and the common source line CELSRC are nonconductive therebetween, thereby causing the potential of bitline BLe to hold a relatively high level H.

Write-verify is almost the same as the regular or "normal" data read, except for the use of a verify voltage Vv (=0.4V) shown in FIG. 8 to be applied to the selected word line WL1. If the threshold of a "0"-write memory cell is below the verify voltage Vv, the bit line BLe and the common source line CELSRC are electrically conducted together, thereby causing the potential of the bitline BLe to be at a relatively low level L (write "Fail"). If the threshold of "0"-write memory cell is above verify voltage Vv, the bit line BLe and common source line CELSRC are rendered, nonconductive therebetween, thereby causing the potential of bitline BLe to have a relatively high level H (write "Pass").

In practice, the data write is performed by repeating a write cycle which includes a write pulse voltage application operation and its following write-verify operation until completion of the writing of all the memory cells of a selected page.

FIG. 10 shows, on the contrary to the case of FIG. 9, the voltages of respective portions during erase, write, read and write-verify operations in the event that the other of the neighboring blocks BLKi-1 and BLKi—namely, the block BLKi on the bitline contact side—is selected. Write and read are in the case where a word line WL5 and even-numbered bit line BLe are selected.

Data erasure is performed by applying an erase voltage Vera (=20V) to the p-type well 11 while giving a 0V voltage to all the word lines WL4–WL7 of the selected block BLKi. Whereby, the individual memory transistor of the selected block BLKi experiences removal or "discharge" of electrons on the floating gate FG and thus is expected to store logic "1" data with a negative threshold. The unselected block BLKi-1's word lines WL0–WL3, select gatelines SOD and SGS, block separation gate lines SGI0 and SGI1 and bit lines BL are set to be electrically floating. Whereby, the control gate of each memory transistor of the unselected block is boosted up to 20V or therearound due to the capacitive coupling with p-well 11; thus, no cells are erased.

In this data erase session, the erase stress in the unselected block is lessened due to the presence of the block separator memory transistors in a similar way to the case of FIG. 9.

At the time of write, apply a 0V voltage to a selected bit line BLe when writing thereinto a logic "0": when writing a logic "1" (write inhibit), apply thereto the supply voltage Vdd (=1.8 to 3V). Apply the write voltage Vpgm (=12 to 20V) to a selected word line WL5; apply a 10V voltage to unselected word lines WL4 and WL6–7 within the selected block BLKi to thereby permit potential rise-up of the channel of a memory transistor being presently selected for "1" write. The procedure up to here is the same as the case of FIG. 9.

As the block separation transistors are driven to turn off in order to electrically isolate the selected block BLKi from the unselected block BLKi-1, give 0V to the block separation gate lines SGI0 and SGI1. Apply a voltage of 4.5V, which is higher than supply voltage Vdd, to the word lines WL0–WL3 of unselected block BLKi-1. This makes it possible to improve the cutoff characteristics of those memory transistors queued along the block separation gate line SGI0. Give Vdd to the bitline side select gate line SGD to make sure that 0V is transferred to the channel of a "0"-write NAND string while at the same time preventing the channel charge of a "1"-write NAND string from being escaped. Set the sourceline side select gate line SGS at 0V.

With such voltage setup, at a memory transistor which is selected by a "0" data-given selected bit line BLe and the selected word line WL5, electrons are injected onto its floating gate FG, resulting in an increase in threshold thereof. At a memory transistor that is selected by a "1" data-given selected bitline BLe and the selected wordline WL5, its control gate CG rises up in potential due to the capacitive coupling; thus, no electrons are injected on the floating gate FG.

In the write or program session stated above, the 4.5V voltage given to the word lines WL0–WL3 of the unselected block BLKi-1 in sufficiently lower than the 10V voltage applied to the unselected wordlines WL4 and WL6–7 within the selected block BLKi. Accordingly, the write stress of the unselected block stays less almost negligibly.

Read is performed by applying a read voltage Vref (=0V) to the selected word line WL5. To ensure that memory transistors excluding the selected memory transistor and the select gate transistors are all kept deeply conductive enough to form a current flow path, apply the mid-level voltage Vm (=4.5V) to the select gate lines SGD and SGS, block separation gate lines SGI0 and SGI1, and unselected word lines WL0–WL3, WL4 and WL6–7.

With the voltage application, if the threshold of a selected memory transistor is lower than the read voltage, the bit line BLe and the common source line CELSRC are made conductive therebetween, resulting in the precharged bit line BLe becoming at a low level L. If the threshold of selected memory transistor is higher than the read voltage, the bit line BL6 and the common source line CELSRC are rendered nonconductive therebetween, thereby causing the potential of bit line BLe to retain a relatively high level H.

Write-verify is the same as the normal data read, except for application of a verify voltage Vv (=0.4V) shown in FIG. 8 to the selected word line WL5. If the threshold of a "0"-write memory cell is below the verify voltage Vv, the bit line BLe and the common source line CELSRC electrically conduct together causing the potential of bitline BLe to reach a relatively low level L (write "Fail"). If the threshold of "0"-write memory cell is above verify voltage Vv, the bit line BLe and the common source line CELSRC are rendered nonconductive therebetween, thereby causing the potential of bit line BLe to become the relatively high level H (write "Pass").

As apparent from the foregoing, in accordance with this embodiment, block divide/splitting of the memory cell array is performed while using two memory transistors within a NAND string as the block separation transistors; thus, it becomes possible to achieve data rewriting (reprogramming) in units of relatively small blocks. In addition, the use of such block separator transistors makes it possible to reduce or minimize the write stress and erase stress in any unselected blocks. Moreover, the block separator transistors used are the ones that are the same in structure as the other memory transistors. Thus it is possible to achieve optimized setup of the threshold levels thereof in an electrical way.

FIG. 11 shows some major voltages of respective portions at the time of erase, write, read and write-verify of memory transistors (block separation transistors) which are coupled to the block separation gate lines SGI. Shown herein is a case where separation gate line SGI1 and even-numbered bit line BLe are selected during writing and reading. At the time of erasing, two block separation gate lines SGI0 and SGI1 are selected. These operations are performed in order to enable threshold adjustment and testing of the memory transistors coupled to separation gate lines SGI prior to shipment of product chips.

Data erasure is performed by giving an erase voltage Vera (=20V) to the p-type well 11 while giving 0V to the block separation gate lines SGI0 and SGI1. Whereby, at each of the memory transistors along block separation gate lines SGI0–SGI1, electrons are drawn out from its floating gate FG, resulting in establishment of a "11 data state with a negative threshold. Word lines WL4–WL7, select gate lines SGD and SGS and bit lines BL are set in an electrically floating state, whereby each potentially rises up to about 20V due to the capacitive coupling with p-type well 11.

Data write (programming) is performed by giving a write voltage Vpgm (=12 to 20V) to a selected block separation gate line SGI1. When setting a selected bit line BLe at 0V, a selected block separator transistor experiences electron injection onto its floating gate FG, resulting in an increase in threshold ("0" write). To inhibit such threshold increase, give the chip-inside supply voltage Vdd (=1.8 to 3V) to the bit line BLe (alp write). Apply Vdd to the bitline side select gate line SGD to thereby preclude removal of any charge from a "1" write NAND string toward the bit line BLe. Apply a 10V voltage to word lines WL0–WL7 and block separation gate line SGI0 in such a way as to permit the channel of a selected "1"-write memory transistor to rise up in potential. Apply 0V to the sourceline side select gate line SGS to thereby prevent the charge of "1" write NAND string from being escaped to the source line CELSRC.

Read is done by applying a read voltage Vref (0V) to the selected block separation gate line SGI1. To ascertain that the select gate transistors and memory transistors other than the selected memory transistor electrically conduct deep enough to form a current flow path, apply 4.5V to the select gate lines SGD and SGS, block separation gate line SGI0, and unselected word lines WL0–WL7. A result of this is as follows. If the threshold value of the selected memory transistor is below the read voltage, the bit line BLe and the common source line CELSRC are conducted therebetween, thereby causing the potential of bitline BLe to become a relatively low level L. If the threshold of selected memory transistor is above the read voltage, the bit line BLe and common source line CELSRC are electrically nonconductive therebetween, resulting in the potential of bitline BLe becoming a relatively high level H.

Write-verify is similar to the normal read, except for application of a verify voltage Vva (=1V) shown in FIG. 8 to the selected block separation gate line SGI1. Whereby, if the threshold of block separator memory transistor is below the verify voltage Vva, the bit line BLe and the common source line CELSRC are electrically coupled together, thereby causing the potential of bit line BLe to reach the relatively low level L. If the threshold is above verify voltage Vva, the bit line BLe and common sourceline CELSRC are rendered nonconductive, resulting in the potential of bitline BLe becoming the relatively high level H.

With the use of a combination of the write and write-verify operations stated above, it is possible to precisely adjust the threshold values of block separation transistors to a threshold state with a lower limit value Vva (about 1V), which is higher than the lower Unit Vv of the threshold distribution of "0" data, as shown in FIG. 8.

Figure 12:
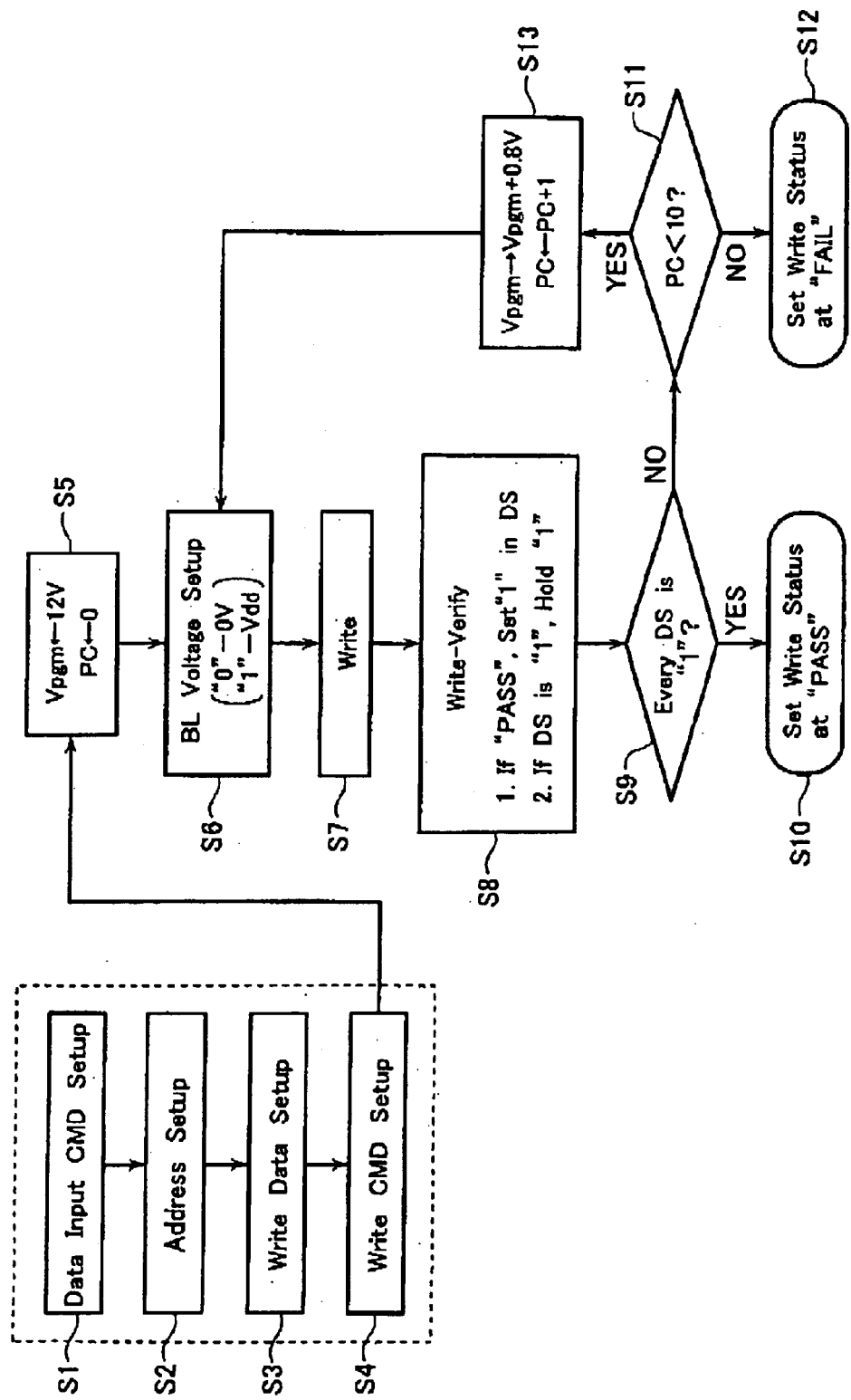
FIG. 12 is a flow diagram of a data write control procedure of the flash memory.

FIG. 12 is a flow diagram showing an algorithm for writing data into memory transistors aligned along a given word line WL.

First, receive a data input command from the host and then set up this command in the state machine 8 of FIG. 1 (at step S1). Then, receive address data from the host and set in the state machine 8 an address for selection of a write page (step S2). Next, receive a page of write data and set corresponding part of the write data in a respective one of data storage modules DS (step S3). Receive a write command as issued from the host and then set this command in the state machine 8 (step S4).

After having set the write command, operations at steps S5 to S13 presented below will be automatically executed by the state machine 8 inside the chip. First, set at 12V the initial value of write voltage Vpgm being given to a selected word line, while setting the write counter PC at zero (step S5). Set up bit line voltages (write control voltages) in accordance with the respective write data stored in the sense amplifiers (data storages DS). More specifically, if the write data is logic "0", set the voltage of bit line BL at 0V; if the data is a logic "1" which means write inhibition, set the voltage of bit line BL at supply voltage Vdd (step 56). Using the write voltage Vpgm and write control voltage thus set up in this way, a write operation is performed for giving a write pulse to a page of memory cells (step 67).

Next, a write-verify operation gets started (step S8). Here, change the data of data storage module(s) DS from "0" to "1", wherein this storage DS corresponds to a certain one of the one page of memory transistors which is such that its detection result exhibits "Pass"—that is, more than one memory transistor that has passed the write-verify test. If the write data retained in the data storage DS is logic "1", let it hold this "1" data as it is. Then, detect whether all data bits of a page of data storage modules DS are "1" or not (step S9).

If a check result at step S9 is "YES" (i.e., the data of all the data storage units DS are logic "1"s), set a write status flagged with "Pass" and terminate the write procedure (step S10). If the check result is "NO", examine the write counter PC (step S11) to determine whether its count value has reached a permissible or allowable maximum value of write execution number for example, ten (10). If the count value in 10, this means that the intended write is failed as being done properly. In this case, set the write status at "Fail", followed by termination of the write session (step S12). If the count value of the write counter PC is less than 10, increase the value of write counter PC by one (1); simultaneously, increase the setup value of write voltage Vpgm by 0.8V (step S13). Then, return to step S6 and repeat the processing of step S7 and its following steps stated above.

Figure 13:
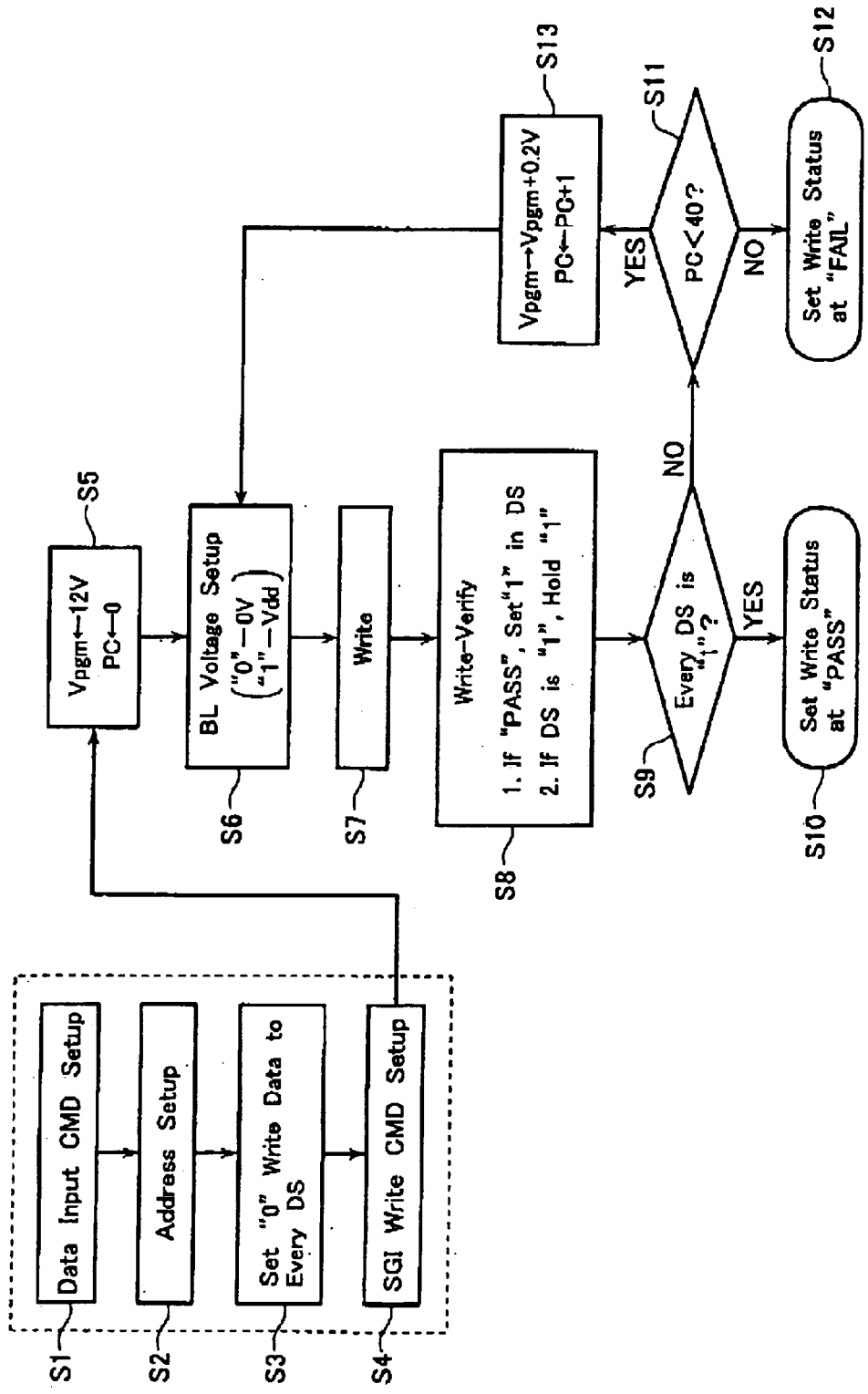
FIG. 13 is a flow diagram of a write control routine of the block separation-use transistor in the flash memory.

FIG. 13 shows a threshold adjustment algorithm for the memory transistors coupled to the block separation gate line SGI.

Firstly, receive a data input command from the host and then set this command in the state machine 8 (at step S1). Then, receive address data from the host and set in the state machine 8 the address for selection of a group of memory transistors to be subjected to threshold adjustment (step S2).

Next, receive a page of write data bits which are all logic "0"s, and set corresponding write data in respective storage modules DS (step S3). Receive an SGI write command as issued from the host and then set this command in the state machine 8 (step 64).

After setup of the SGI write command, operations at steps S5–S13 will be internally executed by the state machine 8 in an automated way. First, set at 12V the initial value of write voltage Vpgm to be given to the block separation gate line SGI, while setting the write counter PC at 0 (step S5). Then, set up bit line voltages, which are the write control voltages in accordance with the data of data storage unit DS of interest. More specifically, if the write data is logic "0", set the voltage of bit line BL at 0V; if the data is a logic "1" which means write inhibition, set the bit line voltage at Vdd (step S6). Note here that all bit lines concerned are set at 0V since the entire first write data bits are logic "0"s. Using the write voltage Vpgm and write control voltage thus set up in this way, a write operation is performed for giving a write pulse to a page of memory cells (step S7).

Next, write-verify gets started (step 68). Change the data of a data storage DS from "0" to "1", wherein this storage DS corresponds to a verify test-passed memory transistor among the memory transistors in one page. In a second write session and its following ones, specify the ones with the data of storage modules DS being logic "1"s, and let them retain as "1" data without change.

Subsequently, detect whether the data bits of all of the date storage modules DS are "1" or not (step S9). If the check result is "YES" (all the data are logic "1"s), set the write status at "Pass" and terminate the write sequence (step S10). If not so, examine the write counter PC (step S16). In case its count value has reached an allowable maximum value of write execution number, for example forty (40), determine that the intended write was not performed properly. If this is the case, set the write status at "Fail", followed by completion of the write routine (step S12). If the count value of the write counter PC is less than 40, increase the count value by one (1); simultaneously, increase the setup value of writs voltage Vpgm by 0.2V (step S13). Then, return to step S6 and go next to the write step S7.

As apparent from the foregoing, it is possible to precisely set at the optimum value the threshold value of the memory transistors coupled to the block separation gate line SGI0, SGI1, by applying a sequence similar to that for writing of the other memory transistors.

With this embodiment, the following effects and advantages are obtainable.

First, it is possible to lower the area ratios of a select gate transistor and contact portion with respect to the area of a block while at the same time suppressing or minimizing an increase in size of the block, which is the unit of erasure. An example is as follows. Suppose that the gate length of a memory transistor is 0.1 micrometer ($\mu$m); the distance or spacing between memory transistors within a NAND string is 0.1 $\mu$m; the distance between a memory transistor and select gate transistor S1. S2 is 0.15 $\mu$m: the gate length of select gate transistor S1, S2 is 0.25 $\mu$m; and the distance spanning from select gate transistor S1, S2 to the center of a contact is 0.15 $\mu$m. As in the prior art. NAND strings each consisting of four memory transistors being laid out to make up a block with 2.128 bytes of storage capacity, a NAND string length per block is equal to:

$$0.15+0.25+0.15+0.1\times7+0.15+0.25+0.15=1.8\ [\mu m].$$

In contrast, as in this embodiment, when NAND strings each having ten memory transistors are arrayed to constitute two blocks each having 2,128 bytes of storage capacity, the per-block NAND string length is given as:

$$(0.15+0.25+0.15+0.1\times19+0.15+0.25+0.15)/2=1.5[\mu m].$$

Second, unlike a scheme for choosing drive conditions to thereby set up a sub-block for use as the erasure unit smaller than a block, more than one block separator memory transistor is present between blocks. Owing to this feature, the write stress and erase stress occurring in unselected blocks may be suppressed to negligibly low levels.

Third, the block separation transistors are similar in structure to other memory transistors. Thus it is possible to set the threshold values of such block separation transistors at the optimal value by use of the sequence similar to that in ordinary or "normal" write events. And with this optimal block separation transistor threshold setup, it becomes possible to provide reliable separation or isolation between blocks while simultaneously minimizing or at least greatly suppressing the write stress and erase stress otherwise occurring in unselected blocks.

Figure 14:
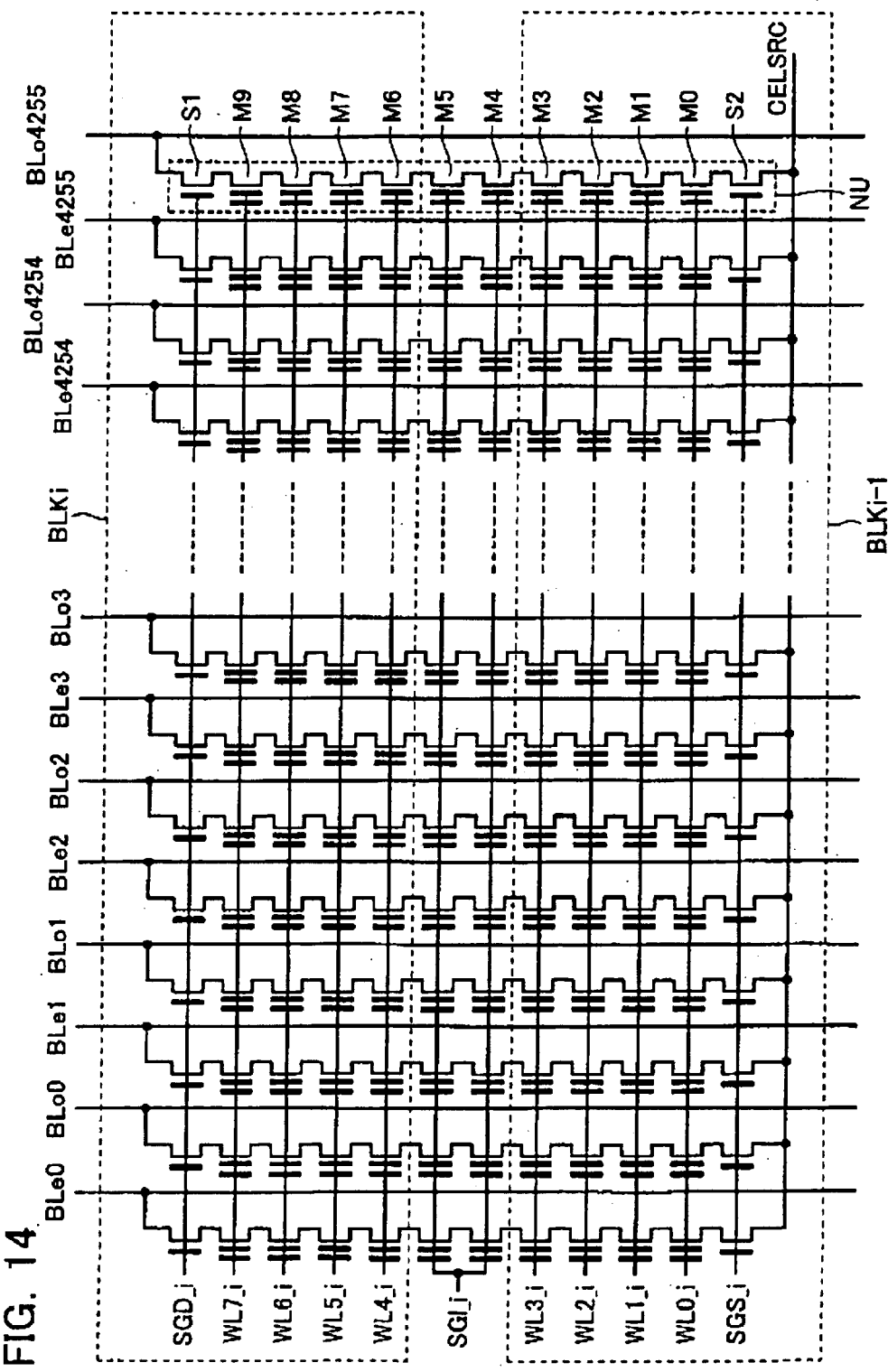
FIG. 14 is a diagram showing a configuration of a memory cell array in accordance with another embodiment of this invention.

FIG. 14 shows a configuration of a memory cell array in accordance with another embodiment of the invention in a way corresponding to FIG. 3. In this embodiment, the block separation gate lines that are connected to the control gates of memory transistors M4–M5 for use as the block separation transistors are bundled and coupled together to a single circuit node SGI which is connected to the row control circuit 3, thereby enabling the both lines to be driven at a time. In this case, two memory transistors M4–M5 are controlled so that these serve as substantially a single block separation transistor. Although this approach lacks the ability to precisely adjust individual threshold values independently of one another when compared to the previous embodiment, the former offers an advantage that the row control circuit 3 may be simplified due to a decrease in number of gate lines required.

Figure 15:
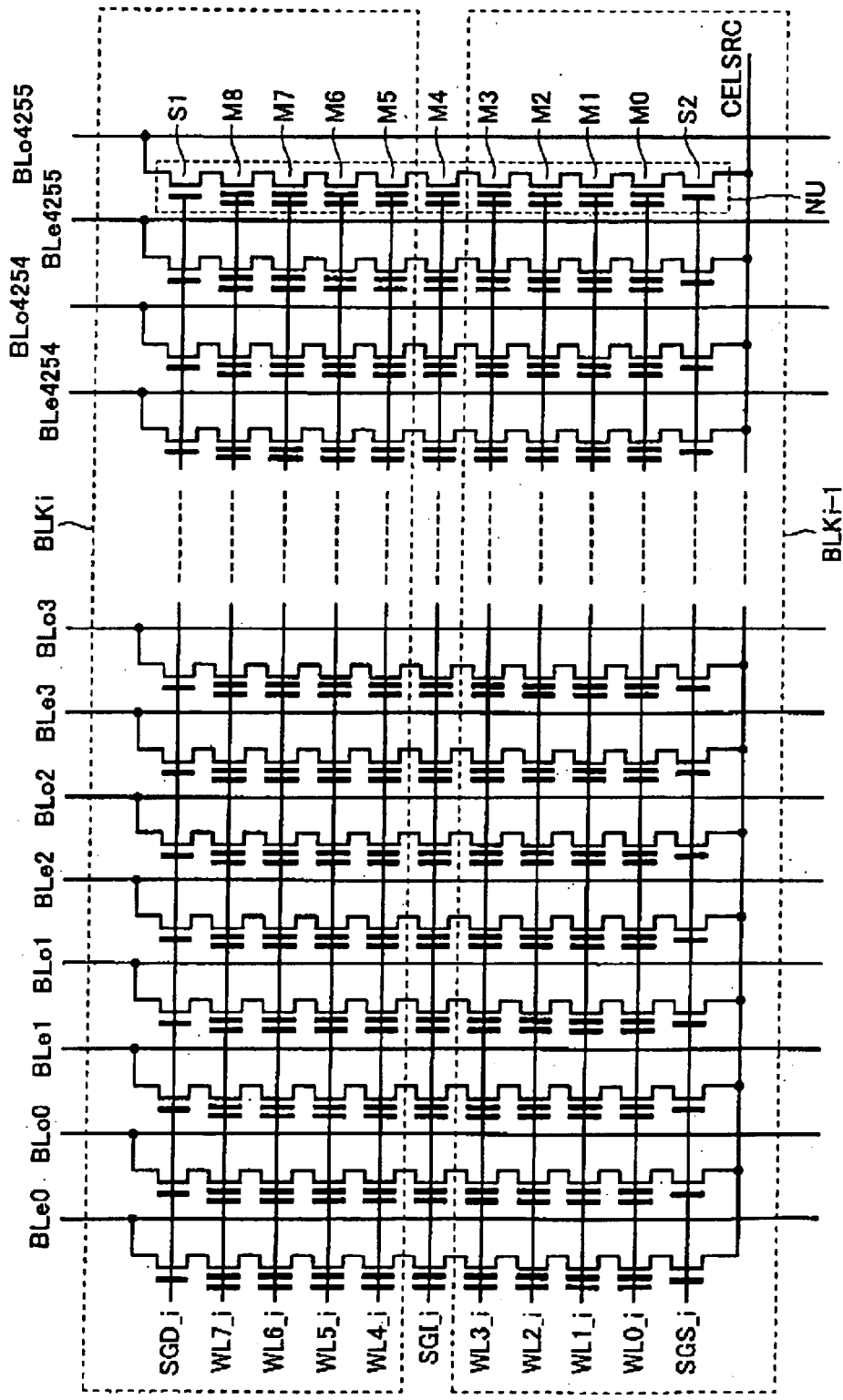
FIG. 15 is a diagram showing a configuration of a memory cell array in accordance with a further embodiment of the invention.

FIG. 15 shows a configuration of a memory cell array in accordance with a further embodiment of the invention in a way corresponding to FIG. 3. In this embodiment, a single centrally located memory transistor M4 of nine memory transistors M0–M8 making up a NAND string NU is used as the block separation transistor, with its control gate connected to a block separation gate line SGI. Four memory transistors M0–M3 on the sourceline contact side are connected at their control gates to word lines WL0–WL3, whereas the other four memory transistors M5–M8 on the bitline contact side are connected at control gates to word lines WL4–7, respectively.

As an embodiment, an electric card using the non-volatile semiconductor memory devices according to the above-described embodiments of the present invention and an electric device using the card will be described bellow.

Figure 16:
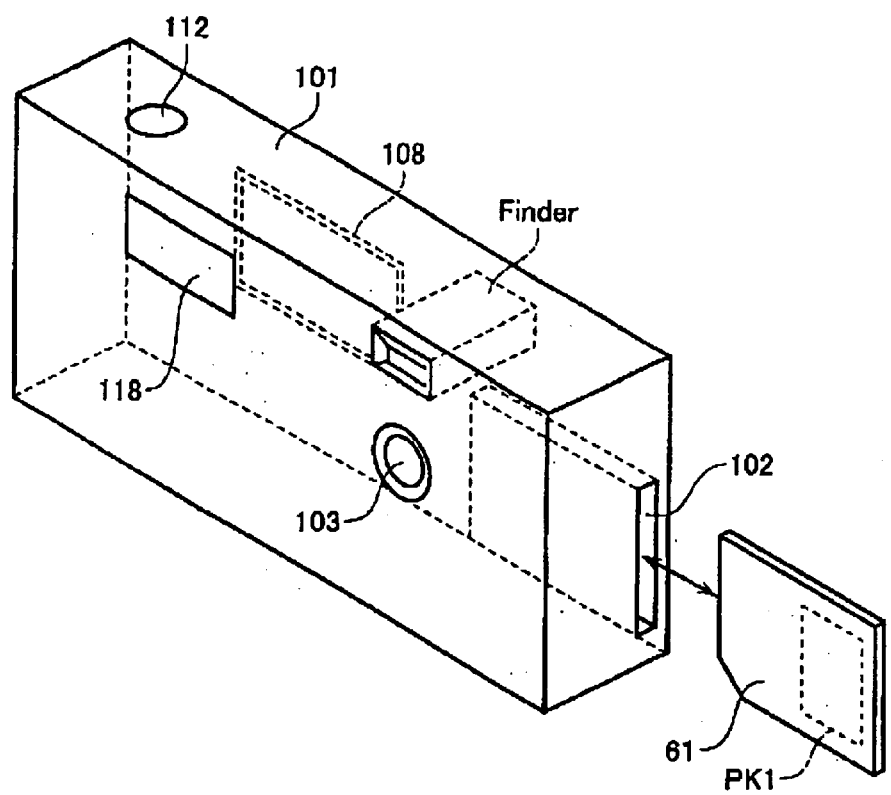
FIG. 16 shows embodiment applied to a digital still camera.

FIG. 16 shows an electric card according to this embodiment and an arrangement of an electric device using this card. This electric device is a digital still camera 101 as an 39 example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 17:
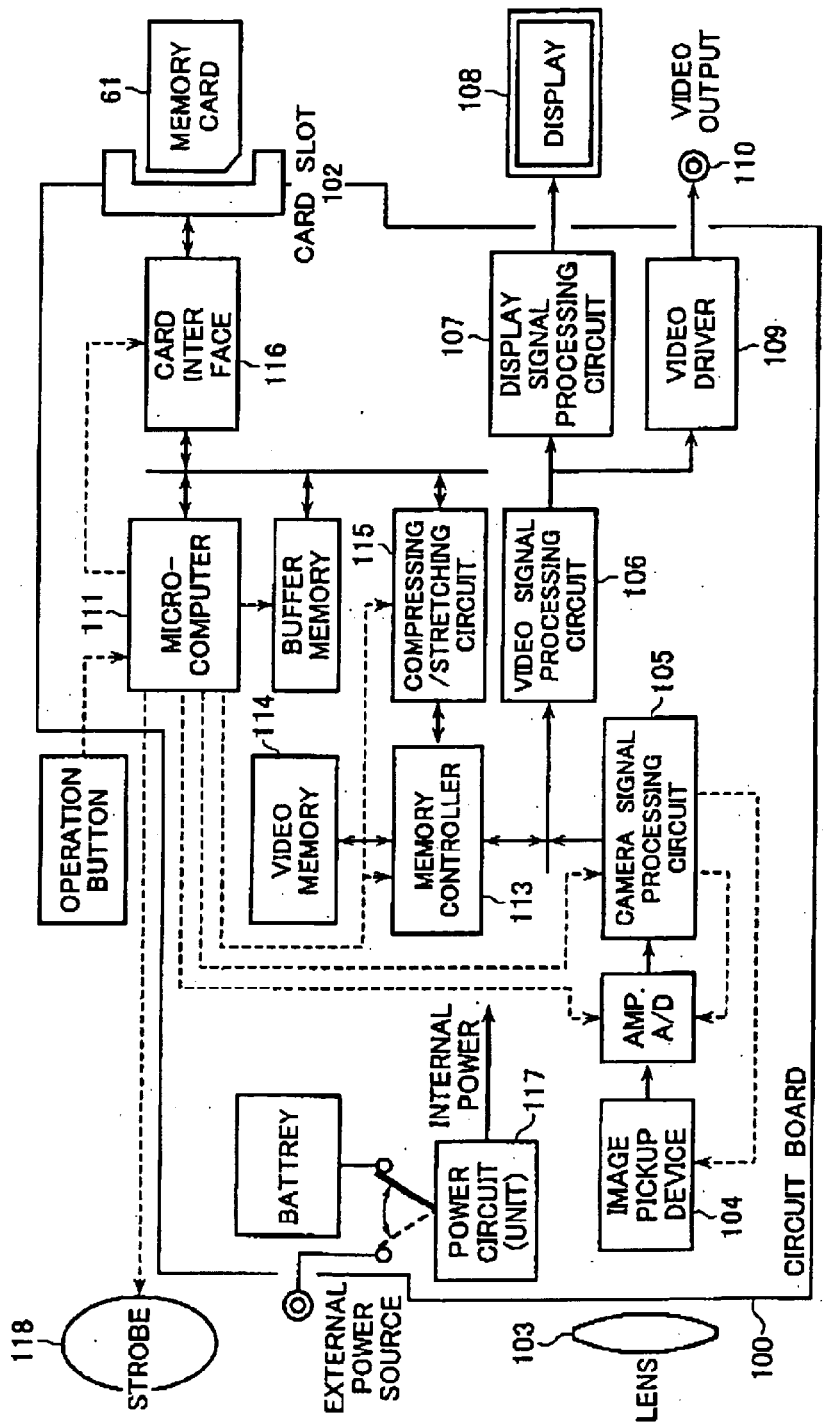
FIG. 17 shows an internal configuration of the digital still camera.
Figure 18A:
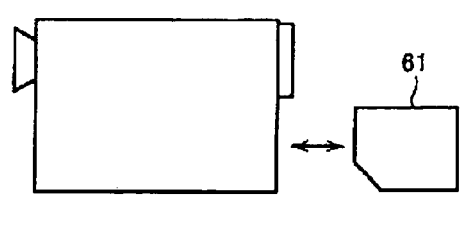
FIGS. 18A to 18J show electric devices in accordance with other embodiments.
Figure 18F:
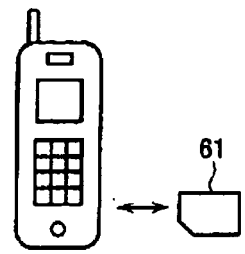
Figure 18B:
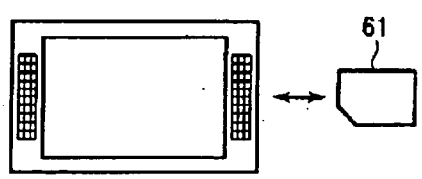
Figure 18G:
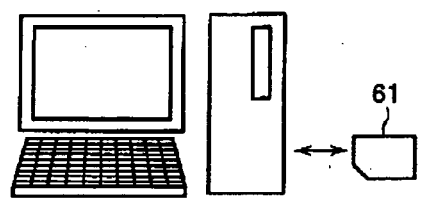
Figure 18C:
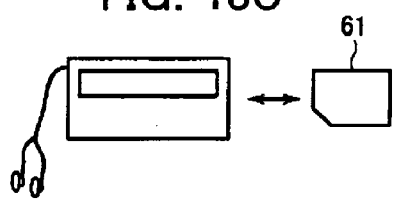
Figure 18H:
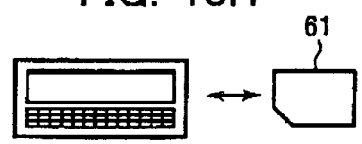
Figure 18D:
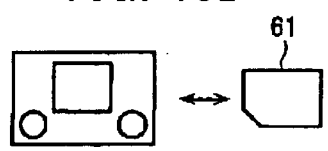
Figure 18I:
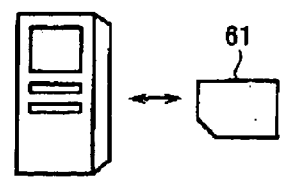
Figure 18E:
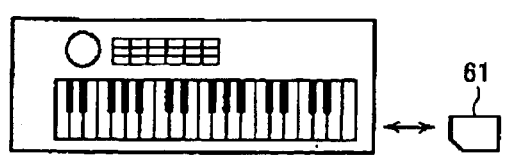
Figure 18J:
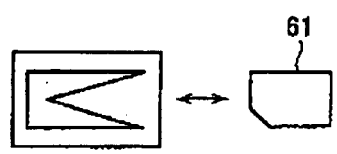

FIG. 17 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AR), automatic white balance control (AWB); color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 100 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP). A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (A"), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102, need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC—DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 18A to 18J, as well as in portable electric devices. That is, the electric card can also be used in a video camera shown in FIG. 18A, a television set shown in FIG. 18B, an audio apparatus shown in FIG. 18C, a game apparatus shown in FIG. 18D, an electric musical instrument shown in FIG. 18E, a cell phone shown in FIG. 18F, a personal computer shown in FIG. 18G, a personal digital assistant (PDA) shown in FIG. 18H, a voice recorder shown in FIG. 19I, and a PC card shown in FIG. 18J.

This invention should not be limited only to the embodiments stated supra. For example, in the embodiments above, the memory cell array is divided into two blocks with the same storage capacity by letting one or two memory transistors residing at a central portion of a NAND string be the block separator transistor or transistors. On the contrary, the blocks to be divided may alternatively be designed so that these are different in capacity from each other, by appropriately selecting the positions of block separator transistors within the NAND string. Optionally, it is also possible to divide the memory cell array into more than three blocks, by letting memory transistors at a plurality of portions within the NAND string be the block separation transistors.

Further note that although the above embodiments are arranged to employ specific memory transistors of the type having a floating gate for use as the charge accumulation layer, these may be replaced with metal-oxide-nitride-oxide-silicon (MONOS) type memory transistors with a silicon nitride film as the charge accumulation layer, when a need arises.

What is claimed is:

1. A non-volatile semiconductor memory device comprising:
   a memory cell array having NAND strings arranged therein, each NAND string having a plurality of electrically rewritable and non-volatile memory transistors connected in series; and
   an erase/write/read control circuit configured to perform erasing, writing and reading of said memory cell array, wherein
   at least one memory transistor within each NAND string of said memory cell array is controlled as a block separation transistor for dividing said memory cell array into a plurality of blocks each serving as a unit of data erasure.

2. The non-volatile semiconductor memory device according to claim 1, wherein
   said memory cell array includes:
   a block separation gate line connected in common to control gates of the respective block separation transistors of NAND strings as disposed in one direction;
   a plurality of word lines each connected in common to control gates of the remaining memory transistors of the NAND strings disposed in the one direction;
   a plurality of bit lines crossing the word lines, one end of each NAND string being connected to a corresponding bit line through a first select gate transistor;
   a common source line to which the other end of each NAND string is connected through a second select gate transistor; and
   first and second select gate lines commonly connected to gates of said first and second select gate transistors disposed in the one direction, respectively.

3. The non-volatile semiconductor memory device according to claim 2, wherein
   said erase/write/read control circuit includes:
   a row control circuit for selectively driving the word lines, the first and second select gate lines and the block separation gate line of said memory cell array;
   a column control circuit having sense amplifiers connected to the respective bit lines of said memory cell array for sensing data and for storing write data;
   a source line control circuit for control of a voltage of the common source line of said memory cell array; and
   a well control circuit for controlling a voltage of a semiconductor well region on which said memory cell array is formed.

4. The non-volatile semiconductor memory device according to claim 2, wherein
   two successive memory transistors within each NAND string serve as block separation transistors, and wherein
   a range of one NAND string length in said memory cell array is divided into two blocks with the block separation transistors placed therebetween.

5. The non-volatile semiconductor memory device according to claim 4, wherein
   two block separation gate lines to which control gates of two block separation transistors within each NAND string are connected respectively are controlled independently of each other.

6. The non-volatile semiconductor memory device according to claim 4, wherein
   two block separation gate lines to which control gates of two block separation transistors within each NAND string are connected respectively are commonly controlled at a time.

7. The non-volatile semiconductor memory device according to claim 2, wherein
data erase of a selected block is performed by setting all of the word lines of unselected blocks, the first and second select gate lines, the block separation gate line, the bit lines and common source line in a floating state, and by giving a ground voltage to all word lines within the selected block while giving a positive erase voltage to a semiconductor well region on which said memory cell array is formed.

8. The non-volatile semiconductor memory device according to claim 2, wherein
data write is performed by precharging a selected bit line of said memory cell array and a NAND string connected thereto in accordance with data, and thereafter giving a power supply voltage and a ground voltage to the first and second select gate lines, respectively, while giving a positive write voltage to a selected word line within the selected block giving to unselected word lines within the selected block a first positive control voltage higher than the supply voltage and yet lower than the write voltage, and giving to all the word lines of unselected blocks and the block separation gate line a second control voltage higher than the supply voltage and lower than the first control voltage.

9. The non-volatile semiconductor memory device according to claim 1, wherein
the block separation transistor is set by an electrical write operation in a predetermined threshold voltage state.

10. The non-volatile semiconductor memory device according to claim 1, wherein
each memory transistor other than the block separation transistor rewritably stores either one of a data "1" state with a negative threshold voltage and a data "0" state with a threshold voltage higher than or equal to a first positive value, and wherein
the block separation transistor is written into a state with a threshold voltage higher than or equal to a second positive value higher than the first positive value.

11. An electric card equipped with a non-volatile semiconductor memory device defined in claim 1.

12. An electric device comprising:
a card interface;
an electric card defined in claim 11 and electrically connectable to said card interface.

13. A non-volatile semiconductor memory device comprising:
a memory cell array having NAND strings arranged therein, each NAND string having plurality of electrically rewritable and non-volatile memory transistors connected in series;
a block separation gate line commonly connected to control gates of memory transistors each selected as a block separation transistor within the respective NAND strings disposed in one direction of said memory cell array;
a plurality of word lines each commonly connected to control gates of the remaining memory transistors within the respective NAND strings disposed in the one direction of said memory cell array;
a plurality of bit lines crossing the block separation gate line and the word lines, one end of ech NAND string of said memory cell array being connected to a corresponding bit line;
a row control circuit for selectively driving the block separation gate line and the word lines and for performing control for dividing said memory call array into a plurality of blocks which become erase units, respectively;
a column control circuit having sense amplifiers connected to the respective bit lines for sensing data and holding write data;
a well control circuit for controlling a voltage of a semiconductor well region on which said memory cell array is formed; and
a source line control circuit for controlling a voltage of a common source line to which the other and of each NAND string of said memory cell array is connected.

14. The non-volatile semiconductor memory device according to claim 13, wherein
said memory cell array has a first select gate transistor for connecting one end of each NAND string to a corresponding bit line and a second select gate transistor for connecting the other end of each NAND string to the common source line, and
gates of the first and second select gate transistors disposed in the one direction of said memory cell array are connected to first and second select gate lines extending in parallel to the word lines, respectively, and
the first and second select gate lines are controlled by the row control circuit.

15. The non-volatile semiconductor memory device according to claim 14, wherein
data erase of a selected block is performed by setting all of the word lines of unselected blocks, the first and second select gate lines, the block separation gate line, the bit lines and the common source line in a floating state, and by giving a ground voltage to all word lines within the elected block while giving a positive erase voltage to the semiconductor well region on which said memory cell array formed.

16. The non-volatile semiconductor memory device according to claim 14, wherein
data write is performed by precharging a selected bit line of said memory cell array and a NAND string connected thereto in accordance with data, and thereafter giving a power supply voltage and a ground voltage to the first select gate line and the second select gate line, respectively, while giving a positive write voltage to a selected word line within the selected block, giving to unselected word lines within the selected block a first positive control voltage higher than the supply voltage and yet lower than the write voltage, and giving to all the word lines of unselected blocks and the block separation gate line a second control voltage higher than the supply voltage and lower than said first control voltage.

17. The non-volatile semiconductor memory device according to claim 13, wherein
two successive memory transistors within each NAND string of said memory cell array are used as block separation transistors, and wherein
a range of one NAND string length in said memory cell array is divided into two blocks with the block separation transistors interposed therebetween.

18. The non-volatile semiconductor memory device according to claim 17, wherein
two block separation gate lines to which control gates of two block separation transistors within each NAND string are connected, respectively, are controlled by the row control circuit independently of each other.

19. The non-volatile semiconductor memory device according to claim 17, wherein two block separation gate lines to which control gates of two block separation transistors within each NAND string are connected, respectively, are controlled in common by the row control circuit.

20. The non-volatile semiconductor memory device according to claim 13, wherein the block separation transistor is set by an electrical write operation in a predetermined threshold voltage state.

21. The non-volatile semiconductor memory device according to claim 13, wherein each memory transistor than the block separation transistor rewritably stores either one of a data "1" state with a negative threshold voltage and a data "0" state with a threshold voltage higher than or equal to a first positive value, and wherein the block separation transistor is written into a state with a threshold voltage higher than or equal to a second positive value higher than the first positive value.

22. An electric card equipped with a non-volatile semiconductor memory device defined in claim 13.

23. An electric device comprising:

a card interface;

a card slot connected to said card interface; and an electric card defined in class 22 and electrically connectable to said card slot.

* * * * *